United States Patent [19]
Anami et al.

[11] Patent Number: 4,542,486
[45] Date of Patent: Sep. 17, 1985

[54] SEMICONDUCTOR MEMORY DEVICE

[75] Inventors: Kenji Anami; Masahiko Yoshimoto; Hirofumi Shinohara; Osamu Tomisawa, all of Hyogo, Japan

[73] Assignee: Mitsubishi Denki Kabushiki Kaisha, Tokyo, Japan

[21] Appl. No.: 500,608

[22] Filed: Jun. 2, 1983

[30] Foreign Application Priority Data

Jun. 2, 1982 [JP] Japan ................................. 57-95932

[51] Int. Cl.[4] .............................................. G11C 11/40
[52] U.S. Cl. .................................... 365/230; 365/189
[58] Field of Search ........................ 365/189, 182, 230

[56] References Cited

U.S. PATENT DOCUMENTS 4,488,266 12/1984 Spence ................................ 365/189

Primary Examiner—Terrell W. Fears
Attorney, Agent, or Firm—Sughrue, Mion, Zinn Macpeak & Seas

[57] ABSTRACT

A semiconductor memory device is improved as regards current consumption and access time by dividing the memory cells into a plurality of columner groups and providing group selecting lines. Front-end word lines of low resistance are connected to outputs of row decoders, and AND gates receive selecting signals on the group selecting lines and the outputs of the front-end word lines. Word lines of a comparatively short length are connected to the AND outputs.

6 Claims, 5 Drawing Figures

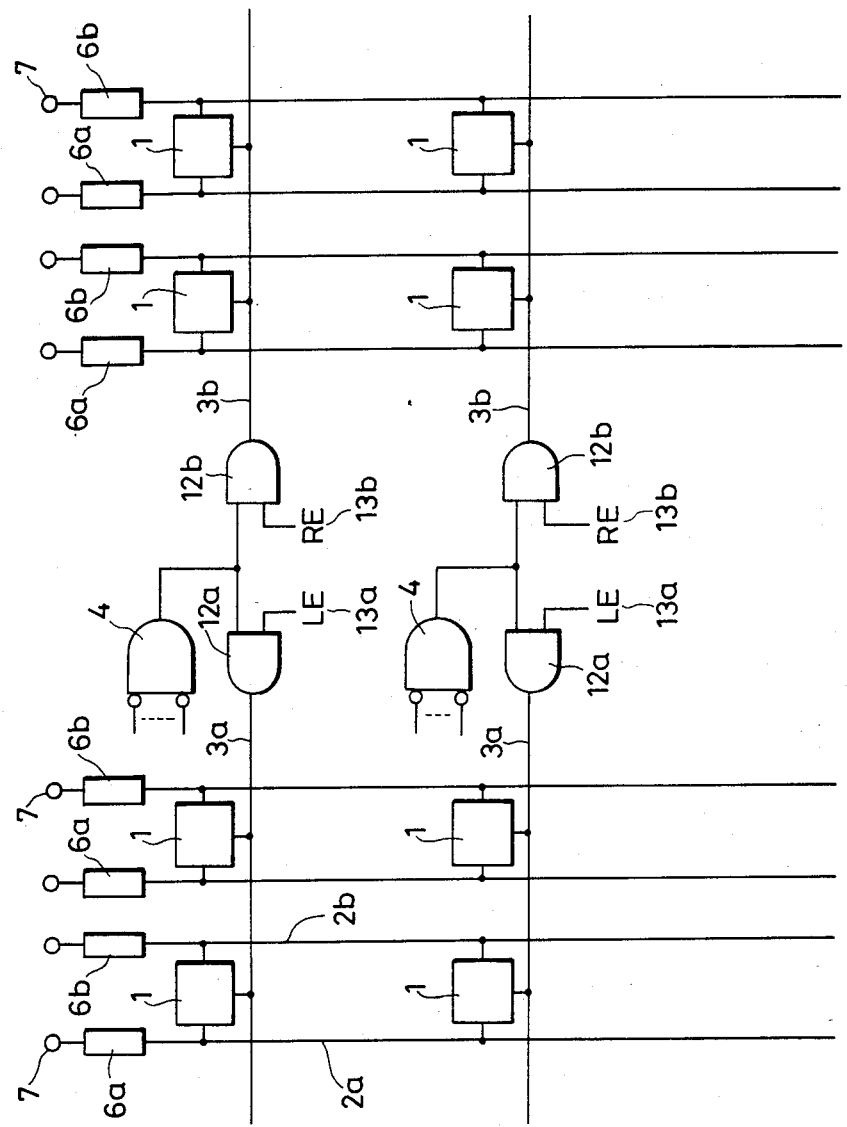

SEMICONDUCTOR MEMORY DEVICE

BACKGROUND OF THE INVENTION

This invention relates to a semiconductor memory device in which the access time is improved and the power consumption is decreased.

FIG. 1 is a block diagram showing a conventional semiconductor memory device. In FIG. 1, reference numeral 1 designates memory cells which are arranged in matrix form and are shown in detail in FIG. 2; 2a and 2b, pairs of complementary bit lines; 3, word lines which, when selected, render active the memory cells thereon; 4, row decoders for decoding row address data; 6a and 6b, bit line loads connected to the bit lines 2a and 2b, respectively; and 7, power source terminals.

In FIG. 2 showing the memory cell 1, reference characters 8a and 8b designate load elements comprising MOS transistors, resistors, etc; 9a and 9b, inverter transistors; 10a and 10b, access transistors; and 11a and 11b, the storage nodes of the memory cell 1.

The operation of the semiconductor memory device thus organized will now be described with respect to the case where, for instance, the nodes 11a and 11b are at "H" and "L" levels, respectively. First, in the case of reading, the address data of a memory cell to be read is applied to an address signal line 5, so that a desired word line 3 is activated through the row decoder 4, whereupon the access transistor 10b which stores the "L" level is rendered conductive. As a result, current from the power source terminal 7 flows in the bit line load 6b, the bit line 2b, the access transistor 10b and the inverter transistor 9b, thus, accomplishing the reading operation.

In this semiconductor device, all of the memory cells on one and the same line are made active, and therefore currents flow to the memory cells from the power source terminals of all the columns. Accordingly, if a large capacity static RAM having a number of columns is formed, a large amount of current is inevitably consumed.

In order to decrease the current consumption, a semiconductor memory device as shown in FIG. 3 has been proposed in the art. In this device, row decoders 4 are arranged in the middle of a memory cell plane, the word lines are divided into a group of left word lines 3a and a group of right word lines 3b, and only the word lines of a selected one of the right and left memory cell groups are made active, so that current flows in only half of the columns. In FIG. 3, reference characters 12a and 12b designate AND gates for selecting the left word lines 3a and the right word lines 3b, respectively; and 13a and 13b, gate signal lines for opening the AND gates 12a and 12b, respectively.

Devices similar to that shown in FIG. 3 are disclosed in articles by Minato et.al.; Ebel et.al.; and Anami et. al. in the ISSCC Digest of Technical Papers; Feb. 1982; pages 250-251; 254-255; and 256-257; respectively. In each case, the current consumption is cut in half by employing decoders arranged between right and left memory arrays.

FIG. 4 is an explanatory diagram showing the arrangement of a conventional semiconductor memory device formed according to the technical concept of FIG. 3. In this device, the row decoders 4a and 4b are arranged in a plurality of columns, and the word lines 3a through 3d are provided in as many as double the number of columns, so that the number of DC current paths is decreased.

However, the conventional semiconductor device suffers from drawbacks in that, as it requires a number of row decoders, the chip area is necessarily large, and the response characteristic and the yield are insufficient.

SUMMARY OF THE INVENTION

Accordingly, an object of this invention is to provide a semiconductor memory device which may be operated at high speed and which is low in power consumption and large in capacity.

The foregoing object and other objects of the invention have been achieved by the provision of a semiconductor memory device which, according to the invention, comprises N memory cell groups which are obtained by dividing a memory cell array into N parts formed by arranging memory cells in matrix form; memory cell group selecting lines for selecting one of said memory cell groups; row decoders for decoding the row address data of a memory cell group to be accessed; front-end word lines connected to the output terminals of the row decoders; AND gates for ANDing selecting signals on the memory cell group selecting lines and the output signals of the front-end word lines; and word lines connected to the output terminals of the AND gates, respectively, the front-end word lines and the word lines being arranged in parallel.

BRIEF DESCRIPTION OF THE DRAWINGS

FIG. 3 is a block diagram showing another example of a conventional semiconductor memory device;

DETAILED DESCRIPTION OF THE PREFERRED EMBODIMENTS

Figure 1:
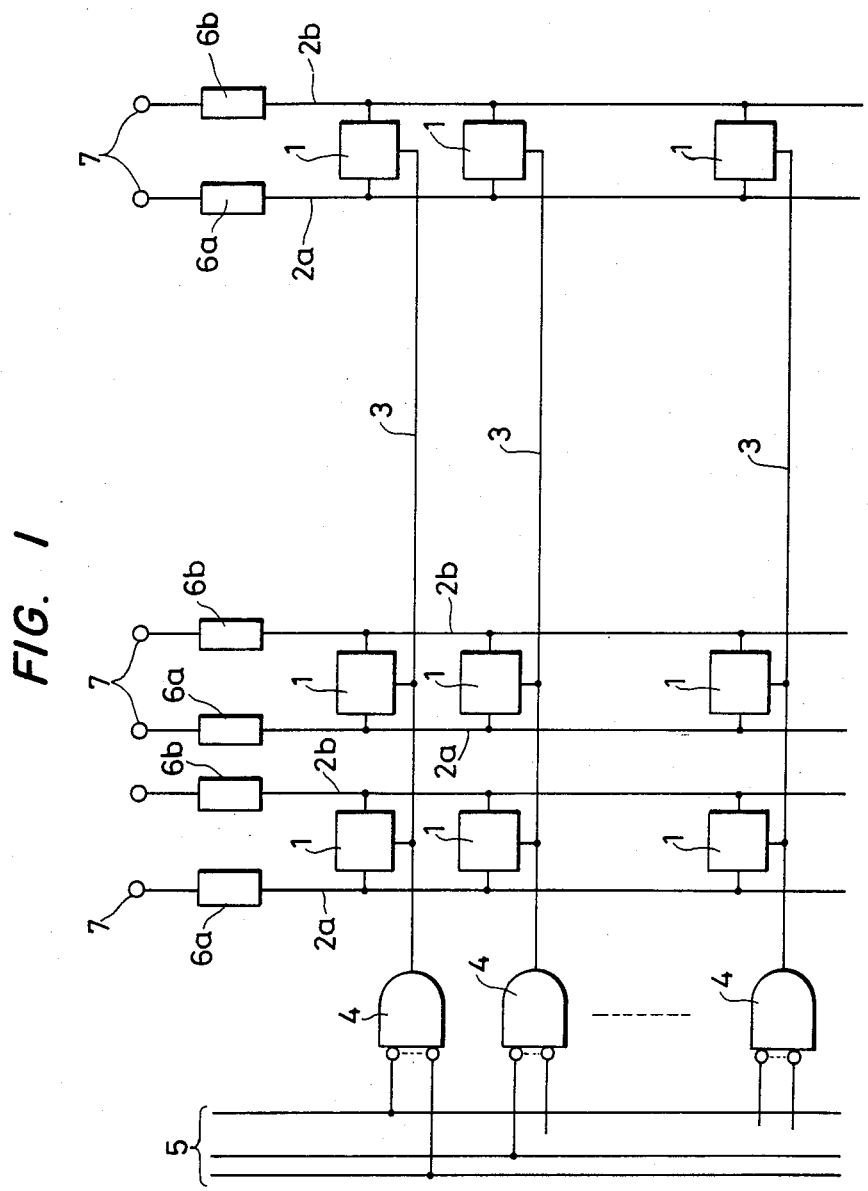
FIG. 1 is a block diagram showing one example of a conventional semiconductor memory devic.
Figure 2:
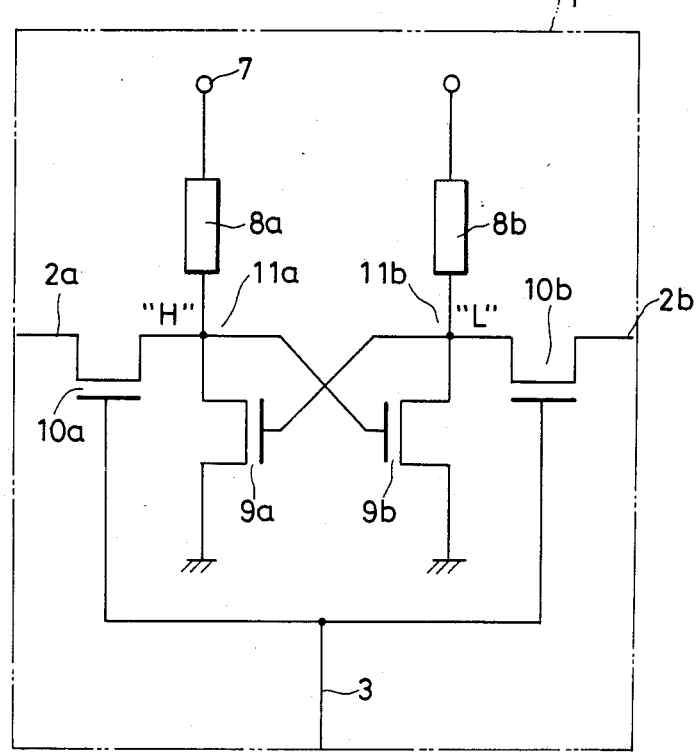
FIG. 2 is a circuit diagram showing the details of a memory cell of FIG. 1.
Figure 4:
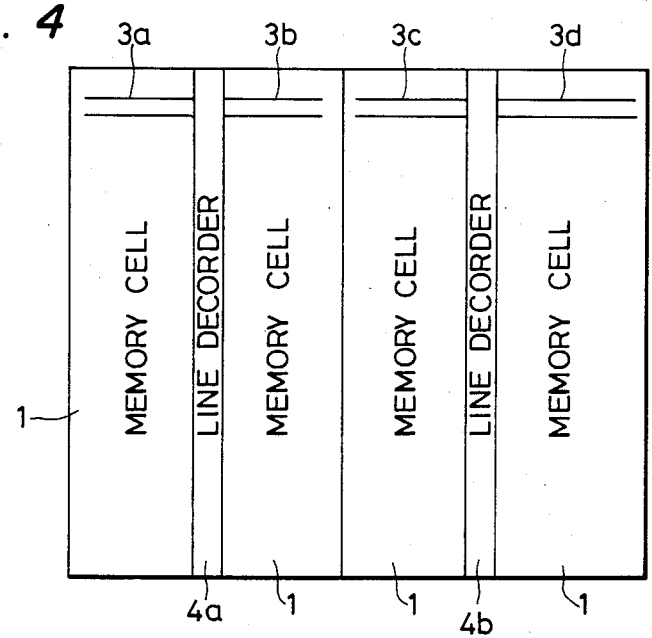
FIG. 4 is a functional diagram showing the construction of a memory device using the concept shown in FIG. 3; and, FIG. 5 is a block diagram showing one example of a semiconductor memory device according to this invention.
Figure 5:
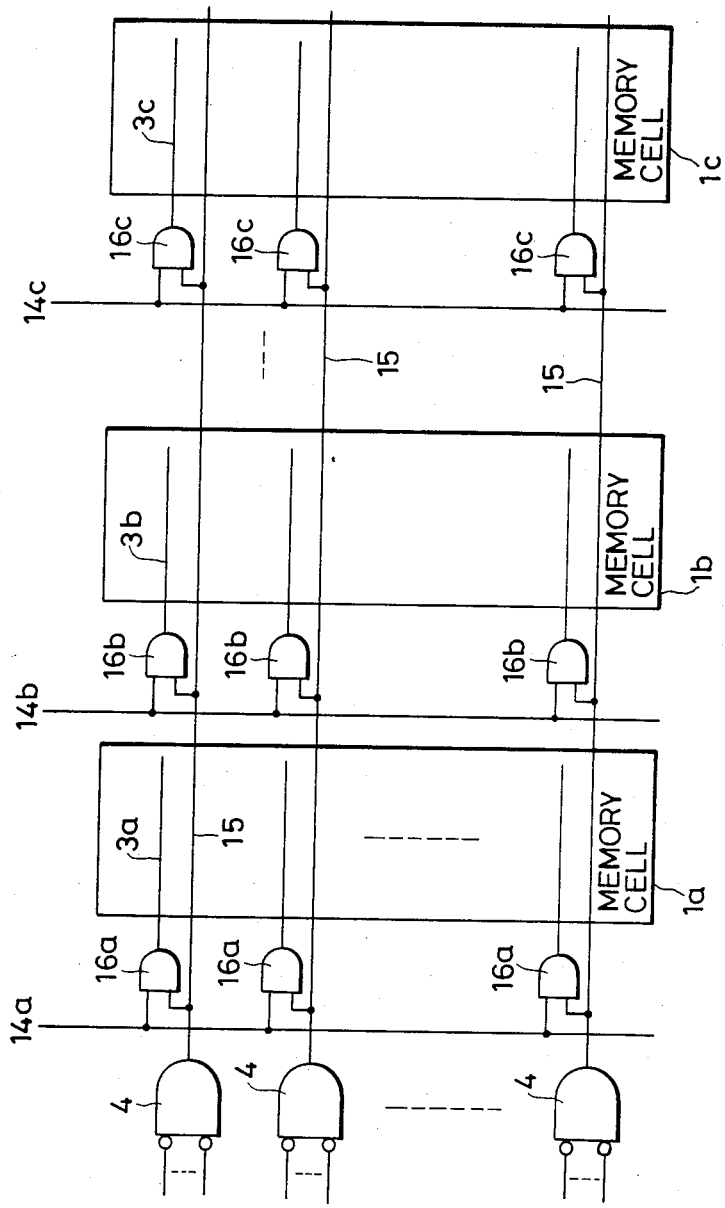

FIG. 5 is a block diagram showing one example of a semiconductor memory device according to this invention. By way of example, memory cell groups 1a, 1b and 1c are arranged in three columns. In FIG. 5, reference characters 14a, 14b and 14c designate memory cell group selecting lines for selecting these memory cell groups 1a, 1b and 1c, respectively; 15, front-end word lines arranged in parallel with the word lines 3a, 3b and 3c; and 16a, 16b and 16c, AND gates having input terminals connected respectively to the front-end word lines 15 and the memory cell selecting lines 14a, 14b and 14c and output terminals connected respectively connected to the word lines 3a, 3b and 3c.

The operation of the semiconductor memory device thus organized will now be described. For instance, in order for a memory cell in the memory cell group is to be selected, the row address data of the memory cell group 1a to be accessed is decoded by the row decoders 4, so that one of the front-end word lines 15 is activated. In this condition, a selecting signal is applied to the memory cell group selecting line 14a. As a result, the corresponding AND gate 16 is opened, and the corresponding word line 3a is activated. Accordingly, column current flows into the memory cell group 1a through a bit line (not shown) from a power source (not shown).

Although the selection of a memory cell in the memory cell group 1a is described above, it goes without saying that in the other memory cell groups, a memory cell can be selected in the same manner. In the above-described example, three memory cell groups are employed; however, the technical concept of the invention is equally applicable to the case where N memory cell groups are provided (where $N \geq 2$). If only the front-end word lines 15 are made of a low resistance material, then the capacitance is small because the word lines are short even through they are somewhat high in resistance. Therefore, the memory cells can be accessed at high speed. Since each of the AND gates 16a, 16b and 16c has only two input terminals and one output terminal, the circuit is simple, and therefore any increase in the chip area can be neglected. In addition, it is apparent that the row decoders 4 may be arranged either in the middle of the chip or at the end thereof.

As was described above in detail, in the semiconductor memory device adcording to the invention, line selection is hierarchically carried out so that a memory cell is selected in two steps by using front-end word lines and word lines. Accordingly, the number of colums including active DC current paths can be decreased. Thus, the semiconductor memory device according to the invention is operable at high speed and is low in power consumption although large in capacity.

What is claimed is:

1. A semiconductor memory device, comprising:
   N memory cell groups, which groups are obtained by dividing a memory cell array into N parts formed by arranging memory cells in matrix form;
   memory cell group selecting lines for selecting one of said memory cell groups;
   row decoders for decoding the row address data of a memory cell group to be accessed;
   front-end word lines connected to the output terminals of said row decoders, respectively.
   AND gates for ANDing selecting signals on said memory cell group selecting lines and output signals of said front-end word lines; and
   word lines connected to the output terminals of said AND gates, respectively.

2. A device as claimed in claim 1, wherein said front-end word lines are lower in resistance than said word lines.

3. A device as claimed in claim 1, wherein said word lines and said front-end word lines are arranged in parallel to one another.

4. A device as claimed in claim 1, said row decoders being arranged at one side of said N memory cell groups.

5. A device as claimed in claim 1, said memory cell groups being arranged in the form of columns.

6. A device as claimed in claim 1, said word lines and said front-end word lines each being arranged perpendicular to the direction of said columns.

* * * * *